United States Patent
Kitahara

(10) Patent No.: US 8,158,531 B2
(45) Date of Patent: Apr. 17, 2012

(54) METHOD OF MANUFACTURING SOLAR CELL AND PLASMA TREATMENT APPARATUS

(75) Inventor: Akinao Kitahara, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 126 days.

(21) Appl. No.: 12/727,656

(22) Filed: Mar. 19, 2010

(65) Prior Publication Data
US 2010/0248409 A1  Sep. 30, 2010

(30) Foreign Application Priority Data
Mar. 31, 2009  (JP) .................................. 2009-084517

(51) Int. Cl.
*H01L 21/302* (2006.01)
*H01L 21/461* (2006.01)

(52) U.S. Cl. ........ 438/753; 438/700; 438/637; 438/514; 257/E21.006; 257/E21.077; 257/E21.288; 257/E21.311; 257/E21.347

(58) Field of Classification Search .................. 438/753, 438/509, 535, 513, 905, 637, 700, 687, 688; 257/E21.006, E21.007, 288, 311, 347
See application file for complete search history.

(56) References Cited

U.S. PATENT DOCUMENTS

| | | | | |
|---|---|---|---|---|
| 5,589,007 | A * | 12/1996 | Fujioka et al. | 136/249 |
| 6,338,872 | B1 * | 1/2002 | Yoshino et al. | 427/248.1 |
| 7,368,398 | B2 * | 5/2008 | Matsubara et al. | 438/758 |
| 2001/0006093 | A1 * | 7/2001 | Tabuchi et al. | 156/345 |
| 2005/0126487 | A1 * | 6/2005 | Tabuchi et al. | 118/723 E |

FOREIGN PATENT DOCUMENTS

JP  2006120853 A  5/2006

* cited by examiner

*Primary Examiner* — David Nhu

(74) *Attorney, Agent, or Firm* — Ditthavong Mori & Steiner, P.C.

(57) ABSTRACT

This method of manufacturing a solar cell includes a step of forming a photoelectric conversion layer on a substrate with a plasma treatment apparatus including a first electrode provided in a treatment chamber, a second electrode and a gas supply source supplying gas into the treatment chamber. A recess portion having a bottom portion in the form of a curved surface is provided on another surface of the first electrode, while a plurality of through-holes are provided on the bottom portion of the recess portion.

13 Claims, 3 Drawing Sheets

METHOD OF MANUFACTURING SOLAR CELL AND PLASMA TREATMENT APPARATUS

CROSS-REFERENCE TO RELATED APPLICATION

The priority application number JP2009-084517, Method of Manufacturing Solar Cell and Plasma Treatment Apparatus, Mar. 31, 2009, Akinao Kitahara, upon which this patent application is based is hereby incorporated by reference.

BACKGROUND OF THE INVENTION

1. Field of the Invention

The present invention relates to a method of manufacturing a solar cell and a plasma treatment apparatus.

2. Description of the Background Art

A method of manufacturing a film with a parallel plate plasma treatment apparatus comprising an upper electrode capable of retaining a substrate and a lower electrode opposed to the upper electrode is known in general.

In the conventional plasma treatment apparatus, the upper electrode and the lower electrode are set in a vacuum chamber to be opposed to each other. The lower electrode is provided with a substrate retaining portion for retaining the substrate on a surface opposed to the upper electrode. The upper electrode is provided with a cylindrical gas supply port having an inlet portion supplied with source gas and an outlet portion communicating with the inlet portion for spouting the gas. The upper electrode is connected to a gas supply source. An exhaust port is provided on one side surface of the vacuum chamber.

The conventional plasma treatment apparatus generates a plasma on the overall lower surface of the upper electrode, so that the plasma decomposes the source gas for forming a film on the substrate.

SUMMARY OF THE INVENTION

A method of manufacturing a solar cell according to a first aspect of the present invention comprises a step of forming a photoelectric conversion layer on a substrate with a plasma treatment apparatus including a first electrode provided in a treatment chamber, a second electrode opposed to one surface of the first electrode and capable of retaining the substrate and a gas supply source supplying gas into the treatment chamber, and a recess portion having a bottom portion in the form of a curved surface is provided on another surface of the first electrode, while a plurality of through-holes are provided on the bottom portion of the recess portion.

A plasma treatment apparatus according to a second aspect of the present invention comprises a first electrode provided in a treatment chamber, a second electrode opposed to one surface of the first electrode and capable of retaining a substrate and a gas supply source supplying gas into the treatment chamber, and a recess portion having a bottom portion in the form of a curved surface is provided on another surface of the first electrode, while a plurality of through-holes are provided on the bottom portion of the recess portion.

In the method of manufacturing a solar cell according to the present invention, ununiformization of the quality and the thickness of a film can be suppressed, whereby an excellent film can be desiredly formed. Thus, a solar cell having excellent performance can be provided. In the plasma treatment according to the present invention, ununiformization of the quality and the thickness of a formed film can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A plasma treatment apparatus 1 according to a first embodiment of the present invention is now described with reference to FIGS. 1 to 4.

Figure 1:
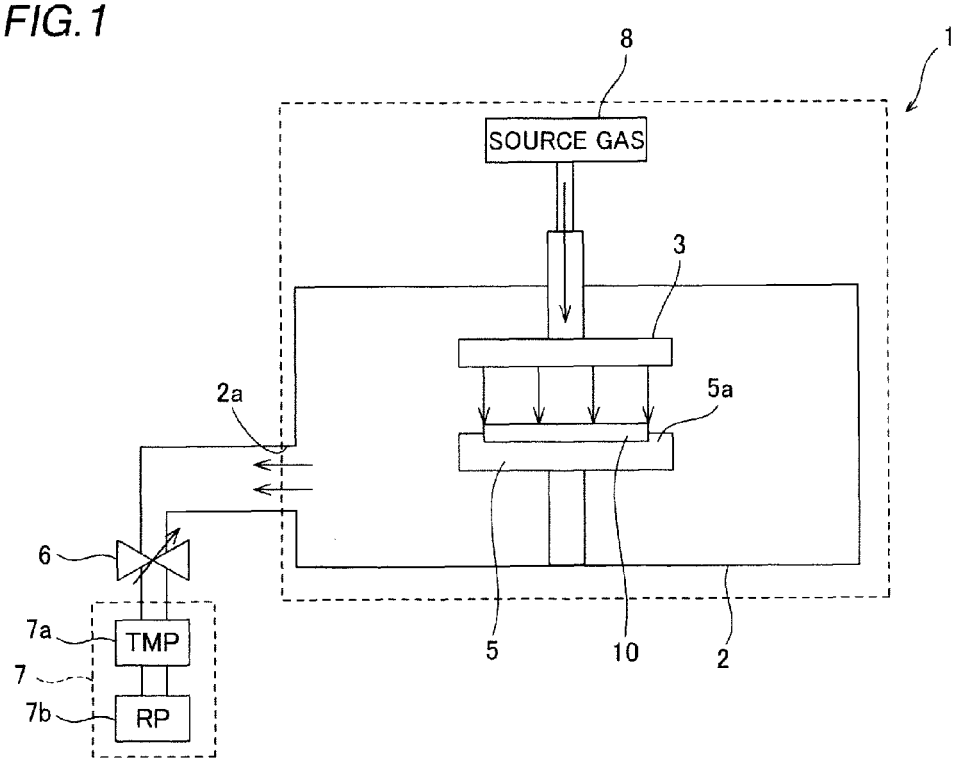
FIG. 1 is a schematic diagram showing a plasma treatment apparatus according to a first embodiment of the present invention.

As shown in FIG. 1, an upper electrode 3 and a lower electrode 5 having parallel structures are set in a vacuum chamber 2, to be opposed to each other. The vacuum chamber 2, the upper electrode 3 and the lower electrode 5 are examples of the "treatment chamber", the "first electrode" and the "second electrode" in the present invention respectively.

The vacuum chamber 2 is provided on a side portion thereof with an exhaust port 2a, is connected to a vacuum exhaust system 7 through an exhaust flow control valve 6. The vacuum exhaust system 7 is constituted of a turbo molecular pump (TMP) 7a and an oil-sealed rotary pump (RP) 7b.

The lower electrode 5 is provided with a substrate retaining portion 5a for retaining a substrate 10 on a side opposed to the upper electrode 3. The upper electrode 3 supplies source gas, and applies high-frequency power of 100 W, for example. The lower electrode 5 is kept at a prescribed potential (ground potential, for example). The lower electrode 5 includes a heating/cooling mechanism portion (not shown) for maintaining the substrate 10 at a prescribed temperature. Each of the surfaces of the upper electrode 3 and lower electrode 5 opposed to each other has an area of about 1500 mm by 1500 mm. The substrate 10 has an area of about 1400 mm by 1100 mm.

Figure 2:
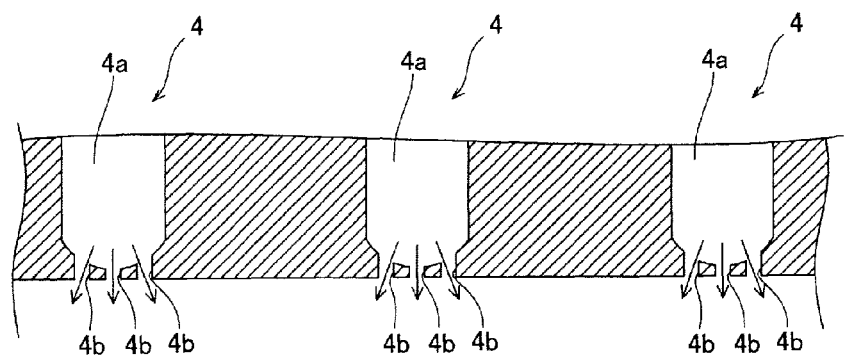
FIG. 2 is an enlarged sectional view of an upper electrode of the plasma treatment apparatus according to the first embodiment shown in FIG. 1.
Figure 3:
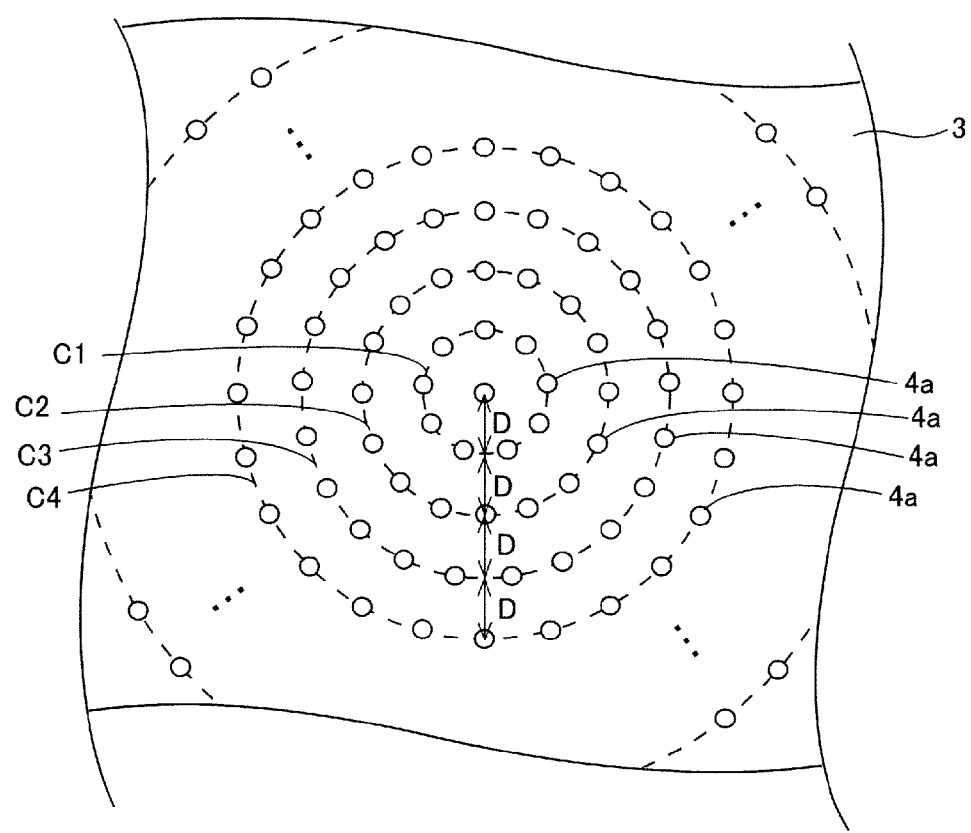
FIG. 3 is a plan view of the upper electrode of the plasma treatment apparatus according to the first embodiment of the present invention.

As shown in FIG. 2, the upper electrode 3 includes gas supply portions 4 each consisting of a recess portion 4a and a plurality of through-holes 4b. As shown in FIG. 3, the gas supply portions 4 (recess portions 4a) are arranged in a concentric pattern over the entire surface of the upper electrode 3. A plurality of concentric circles C1, C2, C3, C4, . . . on which the gas supply portions 4 are arranged are so formed that intervals D therebetween are equal to each other. The upper electrode 3 is so formed that the source gas received from a source gas supply source 8 is supplied through the gas supply portions 4.

The upper electrode 3 is formed by an Al (aluminum) plate having a thickness of at least 1 cm and not more than 2 cm. The recess portions 4a of the gas supply portions 4 are in the form of cylinders having a depth of at least half the thickness of the upper electrode 3 not to pass through the upper electrode 3. The bottom portion of each recess portion 4a is bent in the form of a spherical surface in the depth direction, and the plurality of through-holes 4b are formed on this bottom portion. As shown in FIG. 2, the numbers of the through-holes 4b provided on the plurality of recess portions 4a respectively are equal to each other. The bottom portion of each recess portion 4a, bent in the form of a spherical surface according to the first embodiment, may simply be bent in the form of a curved surface.

Pressures are uniformly applied from the supplied source gas to the inner walls of the recess portions 4a, whereby the source gas is discharged from the through-holes 4b in normal directions of the curved surfaces of the recess portions 4a and supplied to the substrate 10. Thus, the source gas is radially spouted from the gas supply portions 4, as shown by arrows in FIG. 2.

The gas supply portions 4 are so provided that the intervals therebetween are about 10 mm, and so formed that plasmas generated under the gas supply portions 4 respectively overlap each other. The upper electrode 3 may simply be formed by a conductive member, and may be made of Cu (copper) or SUS (stainless steel) in place of Al.

A method of manufacturing a solar cell 20 with the plasma treatment apparatus 1 is now described.

Figure 4:
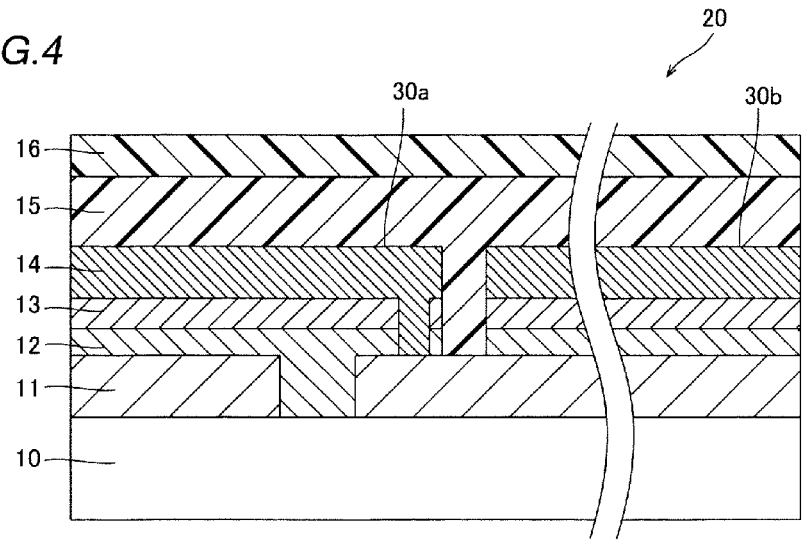
FIG. 4 is an enlarged sectional view of a solar cell according to the first embodiment of the present invention.

In the solar cell 20 manufactured according to the first embodiment, a plurality of photovoltaic elements 30 (30a, 30b, . . . ) are arranged on the substrate 10, as shown in FIG. 4. In each photovoltaic element 30, a transparent conductive film 11, photoelectric conversion units 12 and 13 and a rear electrode 14 are successively stacked on the substrate 10.

The substrate 10, made of a light-transmitting material such as glass, is a single substrate for the solar cell 20. The plurality of photovoltaic elements 30 are formed on the rear surface of the substrate 10 opposite to an incidence side.

The transparent conductive film 11 (substrate-side electrode) is provided on the substrate 10 in the form of a strip in plan view. According to the first embodiment, the transparent conductive film 11 is made of ZnO having high light transmissivity, low resistance and excellent plasticity and requiring a low cost.

The photoelectric conversion units 12 and 13 are provided on the transparent conductive film 11 in the form of strips. The photoelectric conversion units 12 and 13 are made of an amorphous silicon semiconductor and a microcrystalline silicon semiconductor respectively. Throughout the specification, it is assumed that the term "microcrystalline" indicates not only a complete crystalline state but also a state partially including a noncrystalline state.

The rear electrode 14 (rear surface-side electrode) is made of a conductive material such as Ag, and provided on the photoelectric conversion units 12 and 13 in the form of a strip. A layer made of a transparent conductive material may be interposed between the rear electrode 14 and the photoelectric conversion unit 13.

While the photoelectric conversion units 12 and 13 are formed by successively stacking the amorphous silicon semiconductor and the microcrystalline silicon semiconductor, a similar effect can be attained by employing a single layer of a microcrystalline or amorphous photoelectric conversion unit or a laminate of at least three layers. Further, an intermediate layer made of ZnO, $SnO_2$, $SiO_2$ or MgZnO may be provided between a first photoelectric element and a second photoelectric element (the photoelectric conversion units 12 and 13), for improving optical characteristics. In addition, the transparent conductive film 11 may be constituted of a material or a laminate of a plurality of types of materials selected from metallic oxides of $In_2O_3$, $SnO_2$, $TiO_2$ and $Zn_2SnO_4$, in place of ZnO.

The method of manufacturing the aforementioned solar cell 20 with the plasma treatment apparatus 1 is now described.

First, a ZnO electrode 11 having a thickness of 600 nm is formed on the glass substrate 10 having a thickness of 4 mm by sputtering.

Thereafter a YAG laser beam is applied to the glass substrate 10 from the side closer to the ZnO electrode 11, for patterning the ZnO electrode 11 in the form of strips. An Nd:YAG laser having a wavelength of about 1.06 μm, an energy density of 13 $J/cm^3$ and a pulse frequency of 3 kHz is used for this laser separation processing.

Then, the photoelectric conversion units 12 and 13 are formed in the plasma treatment apparatus 1.

More specifically, the substrate 10 is fixed to the substrate retaining portion 5a formed on the surface of the lower electrode 5 of the plasma treatment apparatus 1 opposed to the upper electrode 3, and the vacuum chamber 2 is thereafter evacuated by the vacuum exhaust system 7, as shown in FIG. 1.

Then, the source gas is supplied to the space between the upper electrode 3 and the lower electrode 5 from the through-holes 4b of the upper electrode 3 connected to the source gas supply source 8 (see FIG. 1). At this time, the source gas is radially supplied from the plurality of gas supply portions 4, whereby differences in the concentration of the source gas between portions immediately under the gas supply portions 4 and the spaces between the adjacent ones of the gas supply portions 4 are reduced (lessened). Consequently, the source gas is supplied to the lower electrode 5 in a uniform concentration. Thereafter high-frequency power is supplied to the upper electrode 3, thereby generating plasmas around the gas supply portions 4. The plasmas generated under the gas supply portions 4 overlap each other between the adjacent ones of the gas supply portions 4. Thus, the source gas is decomposed by the plasmas, to form film forming species. The film forming species formed by the source gas decomposed by the plasmas are deposited on the substrate 10, thereby forming a prescribed film (not shown) on the substrate 10.

In order to form the photoelectric conversion unit 12 in the plasma treatment apparatus 1, a p-type amorphous silicon semiconductor layer having a thickness of 10 nm, an i-type amorphous silicon semiconductor layer having a thickness of 300 nm and an n-type amorphous silicon semiconductor layer having a thickness of 20 nm are formed with source gas prepared by mixing $SiH_4$, $CH_4$, $H_2$ and $B_2H_6$ with each other, source gas prepared by mixing $SiH_4$ and $H_2$ with each other and source gas prepared by mixing $SiH_4$, $H_2$ and $PH_4$ with each other respectively, and successively stacked. In order to form the photoelectric conversion unit 13 in the plasma treatment apparatus 1, a p-type microcrystalline silicon semiconductor layer having a thickness of 10 nm, an i-type microcrystalline silicon semiconductor layer having a thickness of 2000 nm and an n-type microcrystalline silicon semiconductor layer having a thickness of 20 nm are formed with source gas prepared by mixing $SiH_4$, $H_2$ and $B_2H_6$ with each other, source gas prepared by mixing $SiH_4$ and $H_2$ with each other and source gas prepared by mixing $SiH_4$, $H_2$ and $PH_4$ with each other respectively, and successively stacked. Table 1 shows the details of conditions of the plasma treatment apparatus 1.

TABLE 1

| | Layer | Substrate Temperature (° C.) | Gas Flow Rate (sccm) | Reaction Pressure (Pa) | RF Power (W) | Thickness (nm) |
|---|---|---|---|---|---|---|
| Amorphous Si Film | p Layer | 180 | $SiH_4$: 300<br>$CH_4$: 300<br>$H_2$: 2000<br>$B_2H_6$: 3 | 106 | 10 | 10 |
| | i Layer | 200 | $SiH_4$: 300<br>$H_2$: 2000 | 106 | 20 | 300 |
| | n Layer | 180 | $SiH_4$: 300<br>$H_2$: 2000<br>$PH_4$: 5 | 133 | 20 | 20 |
| Microcrystalline Si Film | pLayer | 180 | $SiH_4$: 10<br>$H_2$: 2000<br>$B_2H_6$: 3 | 106 | 10 | 10 |
| | iLayer | 200 | $SiH_4$: 100<br>$H_2$: 2000 | 133 | 20 | 2000 |
| | n Layer | 200 | $SiH_4$: 100<br>$H_2$: 2000<br>$PH_4$: 5 | 133 | 20 | 20 |

The stacked photoelectric conversion units 12 and 13 are patterned into the form of strips by applying a YAG laser beam to side portions of patterned positions of the ZnO electrode 11 from the side closer to the ZnO electrode 11. An Nd:YAG laser having an energy density of 0.7 J/cm³ and a pulse frequency of 3 kHz is used for this laser separation processing.

Then, an Ag electrode 14 having a thickness of 200 nm is formed on the photoelectric conversion unit 13 by sputtering. The Ag electrode 14 is formed also on a region from which the photoelectric conversion units 12 and 13 have been partially removed by patterning.

Then, the Ag electrode 14 and the photoelectric conversion units 12 and 13 are separated by applying a YAG laser beam to side portions of patterned positions of the photoelectric conversion units 12 and 13 from the rear surface side, and patterned in the form of strips. An Nd:YAG laser having an energy density of 0.7 J/cm³ and a pulse frequency of 4 kHz is used for this laser separation processing.

Thus, the solar cell 20 having a plurality of connected photoelectric elements connected in series with each other is formed on the glass substrate 10. A filler 15 made of EVA (ethylene vinyl acetate) and a back sheet 16 made of PET/Al foil/PET or the like are provided on the rear electrode 14 of the solar cell 20 as shown in FIG. 4, to form a solar cell module.

The plasma treatment apparatus 1 and the method of manufacturing the solar cell 20 according to the first embodiment can attain the following effects:

(1) The plurality of through-holes 4b are provided on each recess portion 4a of the upper electrode 3 of the plasma treatment apparatus 1. Thus, the source gas can be radially supplied from the plurality of gas supply portions 4 (through-holes 4b), whereby the differences in the concentration of the source gas between the portions immediately under the gas supply portions 4 and the spaces between the adjacent ones of the gas supply portions 4 can be reduced (lessened). Consequently, the source gas can be supplied onto the lower electrode 5 in a uniform concentration. Thus, the quality and the thickness of the film formed on the substrate 10 can be uniformized. Further, ununiformity in supply of the source gas is eliminated, whereby the film can be uniformly formed also when the quantity of the supplied source gas is increased to improve the film forming rate.

(2) The photoelectric conversion units 12 and 13 are formed in the plasma treatment apparatus 1 including the upper electrode 3 provided with the recess portions 4a each having the plurality of through-holes 4b. Thus, ununiformization of the qualities and the thicknesses of the semiconductor layers forming the photoelectric conversion units 12 and 13 can be suppressed, whereby excellent films (semiconductor layers) can be desiredly formed. Consequently, the solar cell 20 can be prevented from reduction in conversion efficiency resulting from ununiformity in the qualities and the thicknesses of the semiconductor layers. Thus, higher power can be extracted from the solar cell 20. In other words, improvement in the film forming rate and prevention of reduction in conversion efficiency of the solar cell 20 can be compatibly attained in the method of manufacturing the solar cell 20 according to the present invention.

Second Embodiment

In a plasma treatment apparatus 1 according to a second embodiment of the present invention, the numbers of through-holes 4b provided on bottom portions of recess portions 4a are adjusted, dissimilarly to the aforementioned first embodiment.

Figure 5:
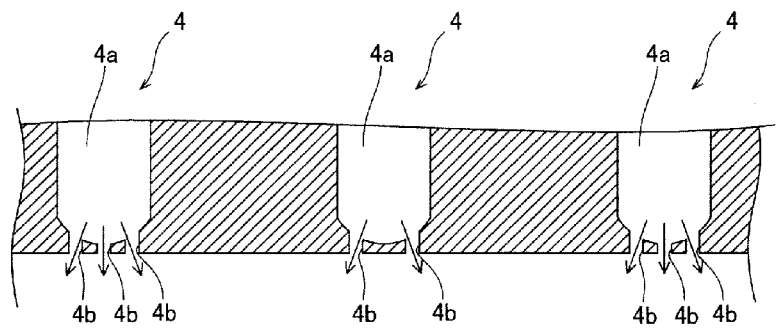
FIG. 5 is an enlarged sectional view of an example of an upper electrode of a plasma treatment apparatus according to a second embodiment of the present invention.

In the plasma treatment apparatus 1 according to the second embodiment, conductance of source gas can be changed by adjusting the numbers of the through-holes 4b provided on the bottom portions of the recess portions 4a, as shown in FIG. 5. For example, the plasma treatment apparatus 1 is so formed that the number (two) of the through-holes 4b in the recess portion 4a arranged on a central region of an upper electrode 3 is smaller than the numbers (three) of the through-holes 4b in the recess portions 4a arranged on peripheral regions of the upper electrode 3. The remaining structure of the second embodiment is similar to that of the aforementioned first embodiment.

The plasma treatment apparatus 1 according to the second embodiment of the present invention can attain the following effect:

(3) The numbers of the through-holes 4b provided on the bottom portions of the recess portions 4a are adjusted. If it is difficult to uniformly generate plasmas, therefore, the quantity of supply of the source gas can be so adjusted that the quantity of supply of film forming species can also be adjusted. The remaining effects of the second embodiment are similar to those of the aforementioned first embodiment.

Third Embodiment

In a plasma treatment apparatus 1 according to a third embodiment of the present invention, opening areas (diameters) of recess portions 4a are adjusted, dissimilarly to the aforementioned first embodiment.

Figure 6:
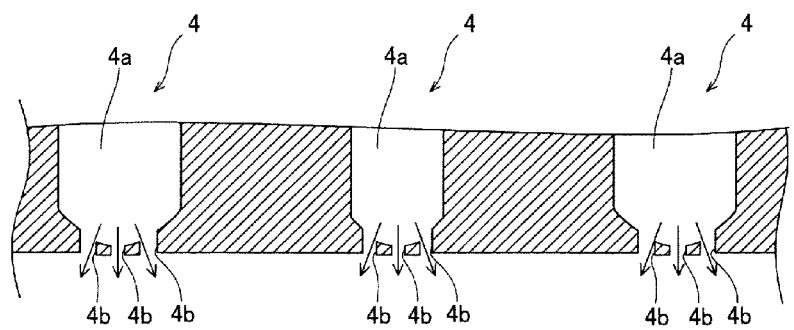
FIG. 6 is an enlarged sectional view of an example of an upper electrode of a plasma treatment apparatus according to a third embodiment of the present invention.

As shown in FIG. 6, the plasma treatment apparatus 1 according to the third embodiment is so formed that the opening area (diameter) of the recess portion 4a arranged on a central region of an upper electrode 3 is narrower (smaller) than the opening areas (diameters) of the recess portions 4a arranged on peripheral regions of the upper electrode 3. The remaining structure of the third embodiment is similar to that of the aforementioned first embodiment.

The plasma treatment apparatus 1 according to the third embodiment of the present invention can attain the following effect:

(4) The opening area (diameter) of the recess portion 4a arranged on the central region of the upper electrode 3 is rendered narrower (smaller) than the opening areas (diameters) of the recess portions 4a arranged on the peripheral regions of the upper electrode 3. Thus, the quantity of supply of source gas can be increased in the peripheral regions of the upper electrode 3 where pressures of the source gas are lowered to reduce the quantity of the supplied gas, whereby the source gas can be more uniformly supplied onto the upper electrode 3. The remaining effects of the third embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the photoelectric conversion units consisting of p-layers, i-layers and n-layers are formed in each of the aforementioned first to third embodiments, the present invention is not restricted to this. The present invention may alternatively be applied to photoelectric conversion units consisting of p-layers and n-layers, for example.

While the gas supply portions (recess portions) are concentrically arranged on the upper electrode in each of the aforementioned first to third embodiments, the present invention is not restricted to this. The gas supply portions (recess portions) may alternatively be arranged on the upper electrode in a shape other than the concentric shape, for example.

While the intervals between the gas supply portions (recess portions) are about 10 mm in each of the aforementioned first to third embodiments, the present invention is not restricted to this. According to the present invention, the intervals between the gas supply portions (recess portions) may alternatively be set to a value other than about 10 nm, so far as the plasmas generated under the adjacent ones of the gas supply portions overlap with each other.

While the number of the through-holes of the recess portion arranged on the central region of the upper electrode is smaller than the numbers of the through-holes of the recess portions arranged on the peripheral regions in the aforementioned second embodiment, the present invention is not restricted to this. According to the present invention, the number of the through-holes of the recess portion arranged on the central region of the upper electrode may alternatively be larger than the numbers of the through-holes of the recess portions arranged on the peripheral regions.

What is claimed is:

1. A method of manufacturing a solar cell, comprising forming a photoelectric conversion layer on a substrate with a plasma treatment apparatus including a first electrode provided in a treatment chamber, a second electrode opposed to one surface of said first electrode and capable of retaining said substrate and a gas supply source supplying gas into said treatment chamber, wherein a recess portion having a bottom portion in the form of a curved surface is provided on another surface of said first electrode, while a plurality of through-holes are provided on said bottom portion of said recess portion.

2. The method of manufacturing a solar cell according to claim 1, wherein the step of forming said photoelectric conversion layer on said substrate with said plasma treatment apparatus includes forming said photoelectric conversion layer including a microcrystalline silicon semiconductor layer.

3. The method of manufacturing a solar cell according to claim 1, wherein the step of forming said photoelectric conversion layer on said substrate with said plasma treatment apparatus includes forming said photoelectric conversion layer including an amorphous silicon semiconductor layer.

4. A plasma treatment apparatus comprising:
a first electrode provided in a treatment chamber;
a second electrode opposed to one surface of said first electrode and capable of retaining a substrate; and
a gas supply source supplying gas into said treatment chamber, wherein
a recess portion having a bottom portion in the form of a curved surface is provided on another surface of said first electrode, while a plurality of through-holes are provided on said bottom portion of said recess portion.

5. The plasma treatment apparatus according to claim 4, wherein said recess portion has a cylindrical shape.

6. The plasma treatment apparatus according to claim 4, wherein the depth of said recess portion is at least half the thickness of said first electrode.

7. The plasma treatment apparatus according to claim 4, so formed that an opening area of said recess portion arranged on a peripheral region of said first electrode is larger than an opening area of said recess portion arranged on a central region of said first electrode.

8. The plasma treatment apparatus according to claim 4, wherein a plurality of said recess portions are so provided that the numbers of said through-holes provided on said bottom portions of said plurality of recess portions respectively are equal to each other.

9. The plasma treatment apparatus according to claim 4, so formed that the number of said through-holes provided on said bottom portion of said recess portion arranged on a peripheral region of said first electrode is larger than the number of said through-holes provided on said bottom portion of said recess portion arranged on a central region of said first electrode.

10. The plasma treatment apparatus according to claim 4, wherein said bottom portion of said recess portion in the form of a curved surface includes a bottom portion in the form of a spherical surface.

11. The plasma treatment apparatus according to claim 4, wherein said gas supplied from said gas supply source is radially supplied through said through-holes provided on said bottom portion of said recess portion.

12. The plasma treatment apparatus according to claim 4, wherein a plurality of said recess portions are provided and so arranged that plasmas generated under said plurality of recess portions respectively overlap each other.

13. The plasma treatment apparatus according to claim 4, wherein a plurality of said recess portions are arranged in a concentric pattern on said first electrode.

* * * * *